United States Patent
Nishimura

(10) Patent No.: US 9,755,105 B2
(45) Date of Patent: Sep. 5, 2017

(54) METHOD FOR PRODUCING LIGHT EMITTING DEVICE

(71) Applicant: Nichia Corporation, Anan-shi, Tokushima (JP)

(72) Inventor: Yoshihiro Nishimura, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/009,049

(22) Filed: Jan. 28, 2016

(65) Prior Publication Data

US 2016/0225944 A1 Aug. 4, 2016

(30) Foreign Application Priority Data

Jan. 30, 2015 (JP) ................................ 2015-017920
Oct. 13, 2015 (JP) ................................ 2015-202384

(51) Int. Cl.
*H01L 33/00* (2010.01)
*H01L 25/16* (2006.01)

(52) U.S. Cl.
CPC ........ *H01L 33/0095* (2013.01); *H01L 25/167* (2013.01); *H01L 2224/16225* (2013.01);
(Continued)

(58) Field of Classification Search
CPC ....... H01L 21/6835; H01L 2221/68327; H01L 21/6836; H01L 2221/68318;
(Continued)

(56) References Cited

U.S. PATENT DOCUMENTS 6,519,500 B1* 2/2003 White ................... G05B 19/00
156/73.1
2002/0014693 A1* 2/2002 Pollock ............... H01L 23/3121
257/724
(Continued)

FOREIGN PATENT DOCUMENTS

JP H10-175205 A 6/1998
JP H11-317383 A 11/1999
(Continued)

OTHER PUBLICATIONS

Notification of Reasons for Refusal issued in Japanese Patent Application No. 2015-202384 mailed Feb. 14, 2017.

*Primary Examiner* — Jaehwan Oh
(74) *Attorney, Agent, or Firm* — Foley & Lardner LLP

(57) ABSTRACT

A method for producing a light emitting device includes providing a light emitting device array including a collective substrate, a plurality of light emitting elements, a covering member covering a region surrounding the plurality of light emitting elements, in which the plurality of light emitting elements and the covering member are arranged on an upper surface of the collective substrate, the collective substrate including a ceramic base member, and the covering member containing a silicone-based resin as a base material; making a cut into the covering member such that the cut has a depth such that an uncut portion remains in the covering member in a direction of the depth' and push-splitting the collective substrate, and splitting the uncut portion of the covering member after the making the cut into the covering member.

21 Claims, 14 Drawing Sheets

(52) U.S. Cl.
CPC .... *H01L 2224/97* (2013.01); *H01L 2924/181* (2013.01); *H01L 2933/005* (2013.01); *H01L 2933/0041* (2013.01)

(58) Field of Classification Search
CPC ....... H01L 2221/6834; H01L 21/67132; H01L 2221/68381
See application file for complete search history.

(56) References Cited

U.S. PATENT DOCUMENTS

| | | | | |
|---|---|---|---|---|
| 2005/0074954 | A1* | 4/2005 | Yamanaka | H01L 27/14618 438/458 |
| 2005/0093146 | A1 | 5/2005 | Sakano | |
| 2005/0199592 | A1* | 9/2005 | Iri | B23K 26/0057 219/121.6 |
| 2007/0273022 | A1* | 11/2007 | Ozeki | H01L 21/481 257/701 |
| 2007/0278513 | A1* | 12/2007 | Chikugawa | H01L 33/54 257/100 |
| 2009/0026620 | A1* | 1/2009 | Ohta | H01L 21/4857 257/758 |
| 2009/0275157 | A1* | 11/2009 | Winberg | H01L 33/20 438/29 |
| 2011/0036897 | A1* | 2/2011 | Nakai | H01L 21/67092 228/1.1 |
| 2011/0133337 | A1* | 6/2011 | Shau | H01L 21/561 257/738 |
| 2011/0138857 | A1* | 6/2011 | Numata | C03B 33/037 65/28 |
| 2011/0261659 | A1* | 10/2011 | Fukuda | H01L 21/50 368/47 |
| 2012/0247291 | A1* | 10/2012 | Kawada | C03B 33/0222 83/33 |
| 2012/0247658 | A1* | 10/2012 | Kawada | C03B 33/0222 156/250 |
| 2013/0026518 | A1* | 1/2013 | Suh | H01L 33/44 257/98 |
| 2013/0134300 | A1* | 5/2013 | Kamamori | G01J 1/42 250/216 |
| 2014/0124822 | A1* | 5/2014 | Yan | H01L 33/641 257/99 |
| 2015/0162219 | A1* | 6/2015 | Terai | H01L 23/3135 257/77 |
| 2016/0282609 | A1* | 9/2016 | Hanaoka | G02B 26/0841 |

FOREIGN PATENT DOCUMENTS

| | | |
|---|---|---|
| JP | 2001-334494 A | 12/2001 |
| JP | 2003-133262 A | 5/2003 |
| JP | 2005-159311 A | 6/2005 |
| JP | 2007-129109 A | 5/2007 |
| JP | 2010-003722 A | 1/2010 |
| JP | 2010-219400 A | 9/2010 |
| JP | 2013-004923 A | 1/2013 |
| JP | 2013-120821 A | 6/2013 |
| JP | 2014-216622 A | 11/2014 |

* cited by examiner

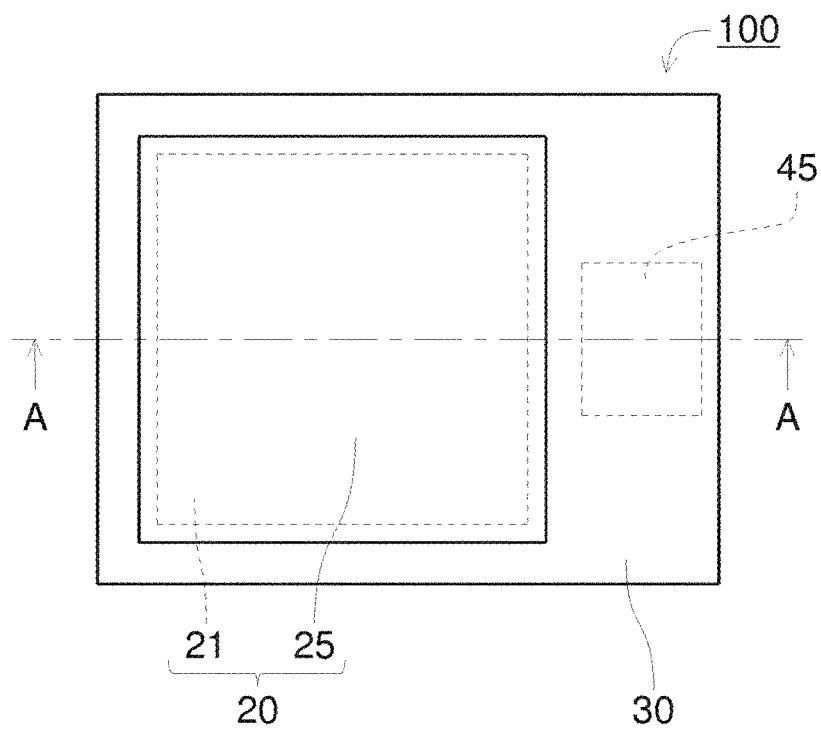

METHOD FOR PRODUCING LIGHT EMITTING DEVICE

CROSS-REFERENCE TO RELATED APPLICATIONS

The present application claims priority to Japanese Patent Application No. 2015-017920, filed on Jan. 30, 2015, and Japanese Patent Application No. 2015-202384, filed on Oct. 13, 2015, which are incorporated by reference in their entireties.

BACKGROUND

1. Field of the Invention

The present invention relates to a method for producing a light emitting device.

2. Description of Related Art

In Patent Literature 1: JP 2003-133262A, for example, discloses a method for producing a semiconductor package comprising a step of forming dividing grooves on one surface of a ceramic wiring board, a step of mounting semiconductor elements on the other surface of the wiring board, a step of sealing the semiconductor elements with an epoxy sealing resin, a step of forming dividing recesses on the sealing resin surface at the positions corresponding to the dividing grooves of the wiring board, and a step of dividing an integrated body of the wiring board and sealing resin at the dividing grooves and dividing recesses.

However, a silicone-based resin, for example, which has recently been widely used as a sealing resin for a light emitting diode (hereinafter abbreviated as "LED"), has a high rubber elasticity, unlike a hard epoxy-based resin, and is difficult to cut using a rotary blade or the like, so that a simultaneous cutting of both the resin and the hard ceramic wiring board may be complicated.

SUMMARY

Embodiments of the present invention have been devised in view of the circumstances described above, and one object is to provide a method for producing a light emitting device with good mass production efficiency in which a light emitting element, and a covering member containing a silicone-based resin as a base material and covering a region surrounding the light emitting element, are disposed on a substrate that contains a ceramic base member.

The method for producing the light emitting device according to one embodiment of the present invention comprises providing a light emitting device array including a collective substrate, a plurality of light emitting elements, and a covering member containing a silicone-based resin as a base material and covering a region surrounding the plurality of light emitting elements on an upper surface of the collective substrate, in which the collective substrate includes a ceramic base member; making a cut into the covering member so that the cut has a depth such that an uncut portion remains in the covering member in a direction of the depth; and push-splitting the collective substrate, and splitting the uncut portion remaining in the covering member after the making the cut into the covering member.

According to one embodiment of the present invention, a light emitting device including a light emitting element and a silicone-based resin covering member that covers a region surrounding the light emitting element disposed on a substrate including a ceramic base material can be produced with good mass production efficiency.

BRIEF DESCRIPTION OF THE DRAWINGS

FIG. 1A is a schematic top view of the light emitting device according to one embodiment of the present invention.

DETAILED DESCRIPTION OF EMBODIMENTS

Figure 1B:
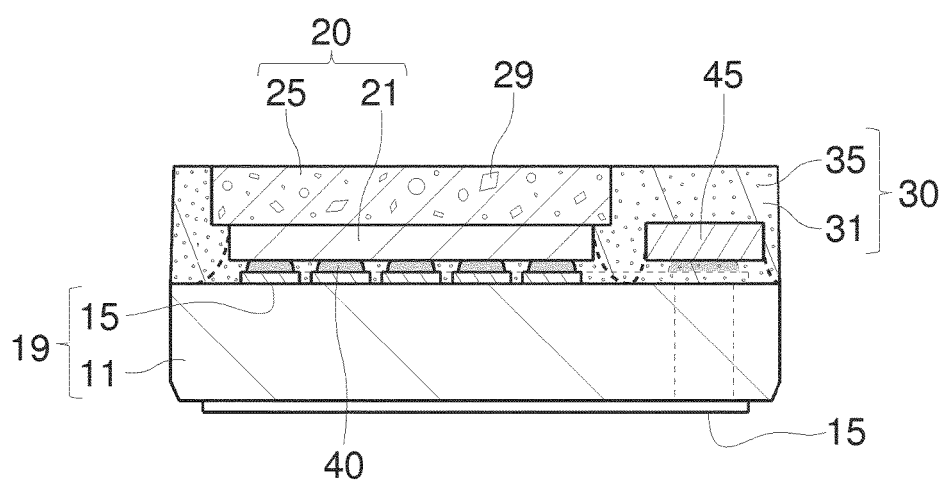
FIG. 1B is a schematic cross-sectional view taken along line A-A of FIG. 1A.

Embodiments of the present invention will be explained below with reference to drawings. A light emitting device and a method for producing the light emitting device explained below are described to give a concrete form to technical ideas of the present invention, and the scope of the present invention is not limited to those described below unless otherwise specified. The sizes and positional relationships of the components illustrated in the drawings might be exaggerated for clarity of the explanations.

Embodiment 1

Light Emitting Device

FIG. 1A is a schematic top view of a light emitting device 100 according to Embodiment 1 of the present invention, and FIG. 1B is a schematic cross-sectional view taken along line A-A of FIG. 1A.

As shown in FIGS. 1A and 1B, the light emitting device 100 according to Embodiment 1 includes a substrate (single substrate) 19, a light emitting element 20 disposed on the upper surface of the substrate 19, a covering member 30, and a protective element 45 (the protective element 45 can be omitted). The substrate 19 includes a ceramic base member 11, and wirings 15 disposed on both the upper surface and a lower surface of the base member 11. The light emitting element 20 includes an LED chip 21 and a light transmissive member 25. The LED chip 21 is mounted on the wirings 15 of the substrate via a bonding member 40. The light transmissive member 25 is adhered onto the LED chip 21. The light transmissive member 25 contains a fluorescent material 29. The protective element 45, disposed adjacent to the light emitting element 20, is mounted on the wirings 15 of the substrate. The covering member 30 covers a region surrounding the light emitting element 20. More specifically, the covering member 30 covers at least approximately entire regions of lateral surfaces of the light emitting element 20, while the upper surface of the light emitting element 20 (in other words, an upper surface of the light transmissive member 25) is exposed from the covering member 30. In this embodiment, moreover, the covering member 30 partially covers the lower surface of the light emitting element 20. Furthermore, the protective element 45 is completely embedded in the covering member 30. The covering member 30 contains a silicone-based resin as a base material 31, and contains a white pigment 35 in the base material 31.

The light emitting device 100 configured as above is mounted on a circuit board by soldering, or the like, using the wirings 15 disposed at a lower surface of the substrate 19 as the external connection terminal, and emits light when supplied with electrical current from an external power supply. At this point, the covering member 30 colored white by the white pigment 35 highly efficiently reflects the light emitted by the light emitting element 20, so that the upper surface of the light emitting element 20 (in other words, the upper surface of light transmissive member 25) is a main emission region of the light emitting device 100.

Method for Producing a Light Emitting Device

Figure 2A:
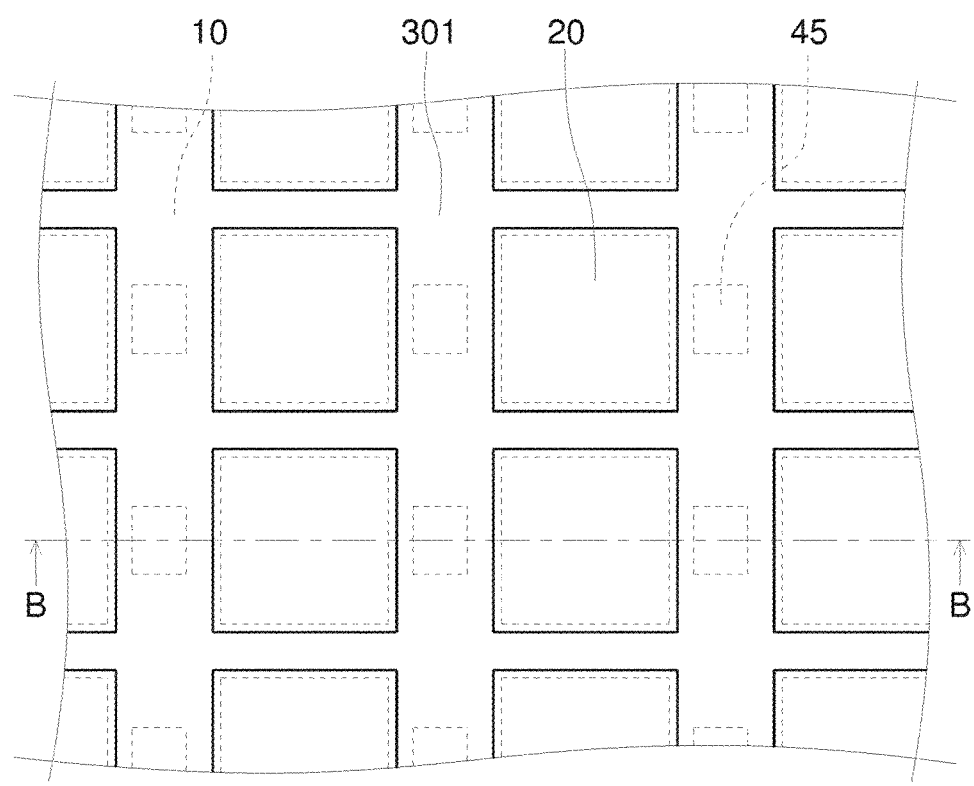
FIG. 2A is a schematic top view showing a step of the method for producing a light emitting device according to one embodiment of the present invention.
Figure 2B:
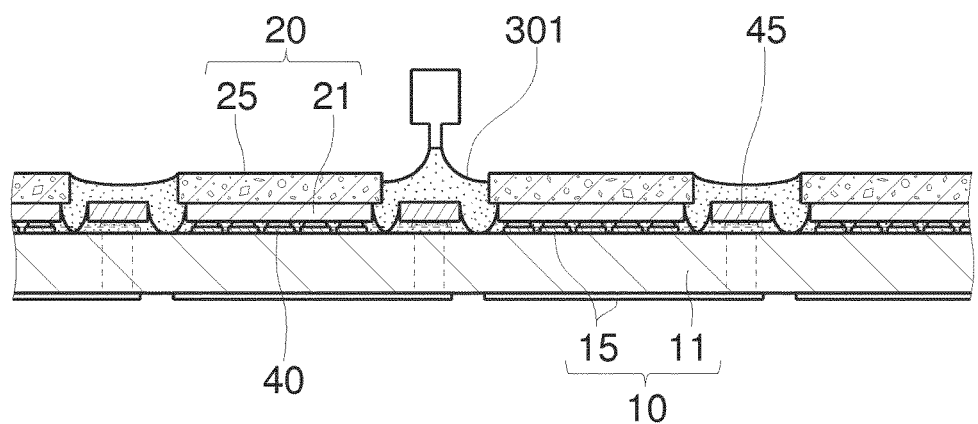
FIG. 2B is a schematic cross-sectional view taken along line B-B of FIG. 2A.
Figure 3A:
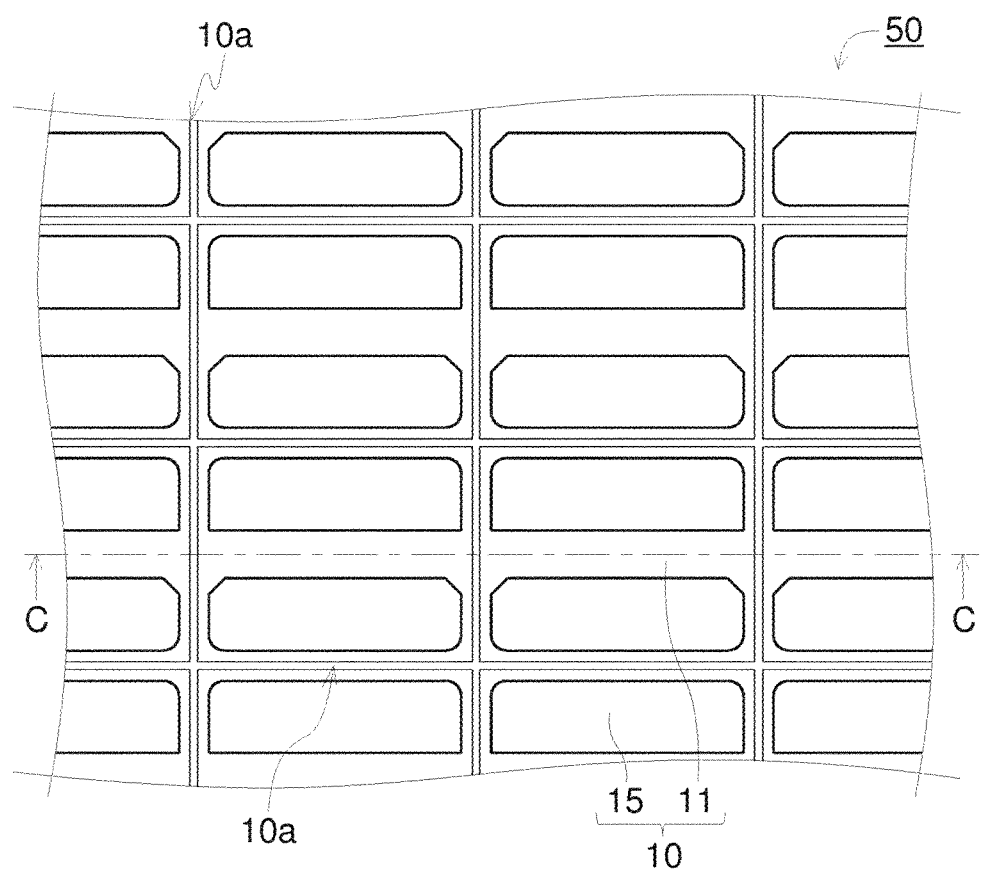
FIG. 3A is a schematic bottom view showing a step of the method for producing a light emitting device according to one embodiment of the present invention.
Figure 3B:
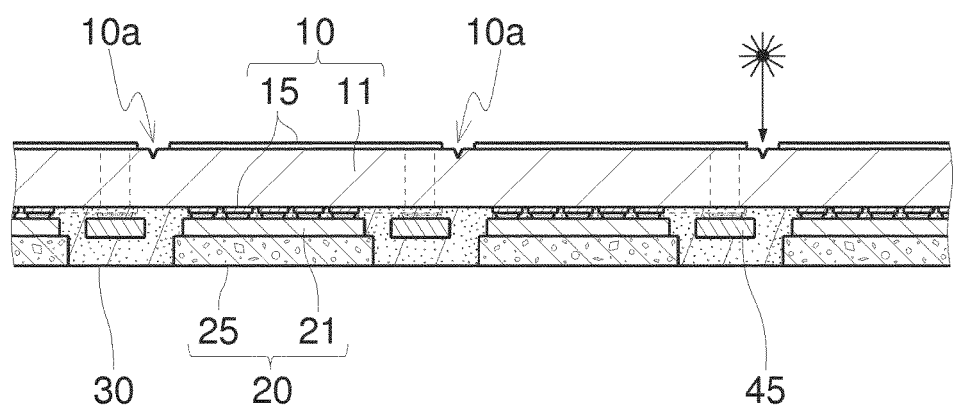
FIG. 3B is a schematic cross-sectional view taken along line C-C of FIG. 3A.
Figure 4A:
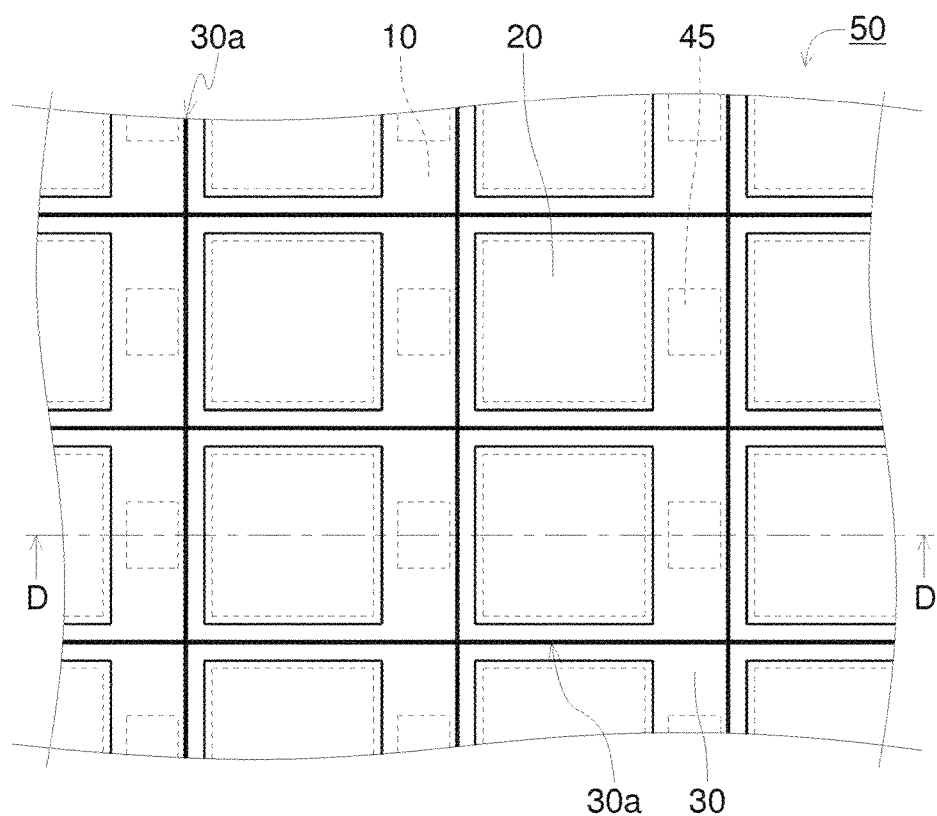
FIG. 4A is a schematic top view showing a step of the method for producing a light emitting device according to one embodiment of the invention.
Figure 4B:
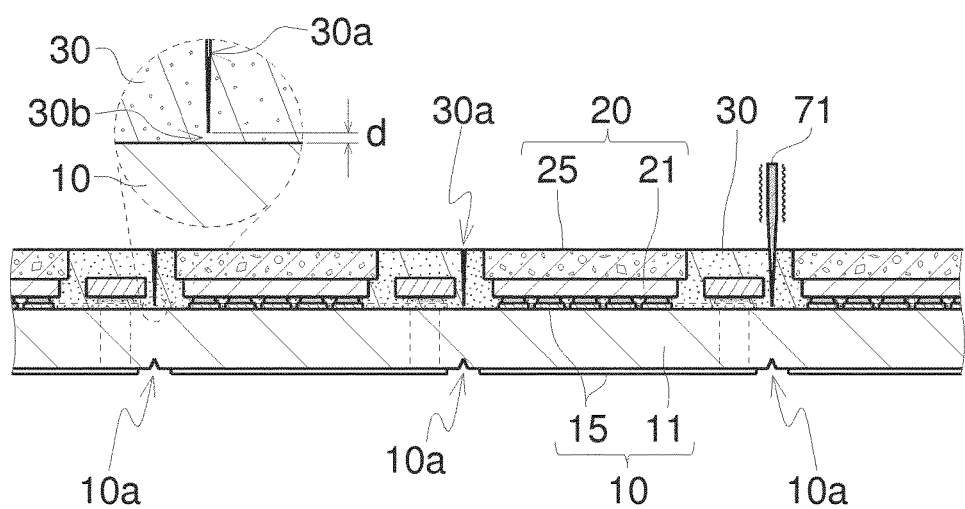
FIG. 4B is a schematic cross-sectional view taken along line D-D of FIG. 4A.
Figure 5A:
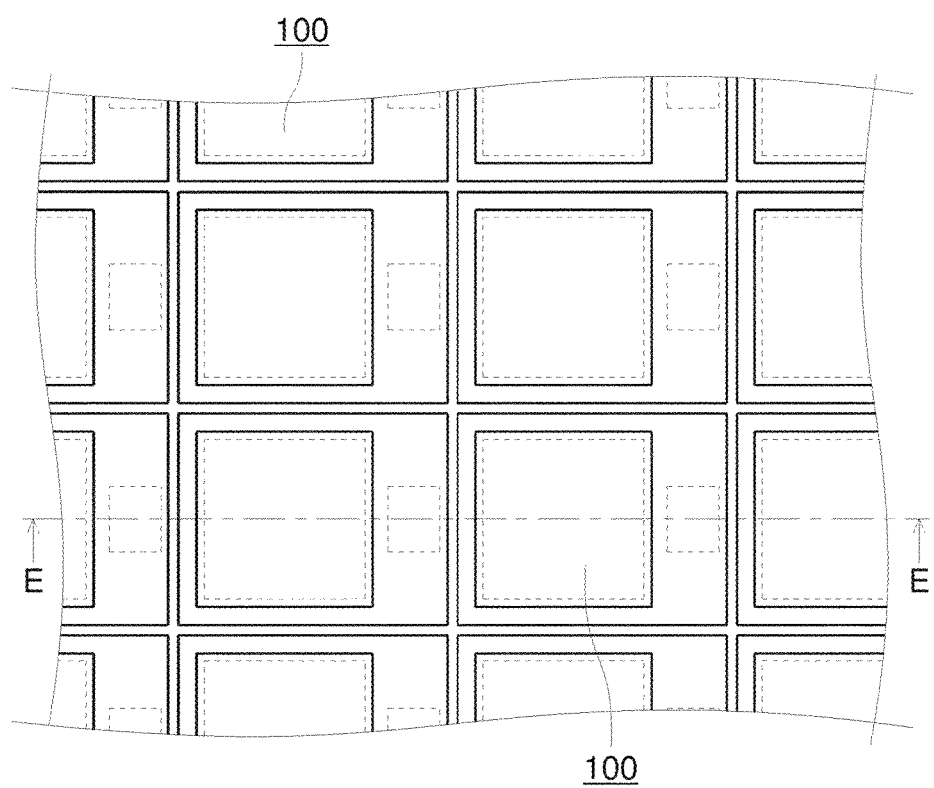
FIG. 5A is a schematic top view showing a step of the method for producing a light emitting device according to one embodiment of the present invention.
Figure 5B:
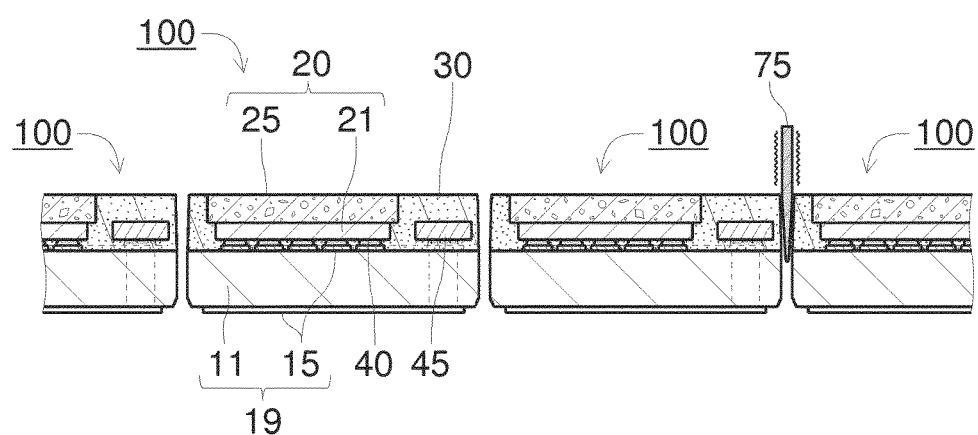
FIG. 5B is a schematic cross-sectional view taken along line E-E of FIG. 5A.
Figure 6A:
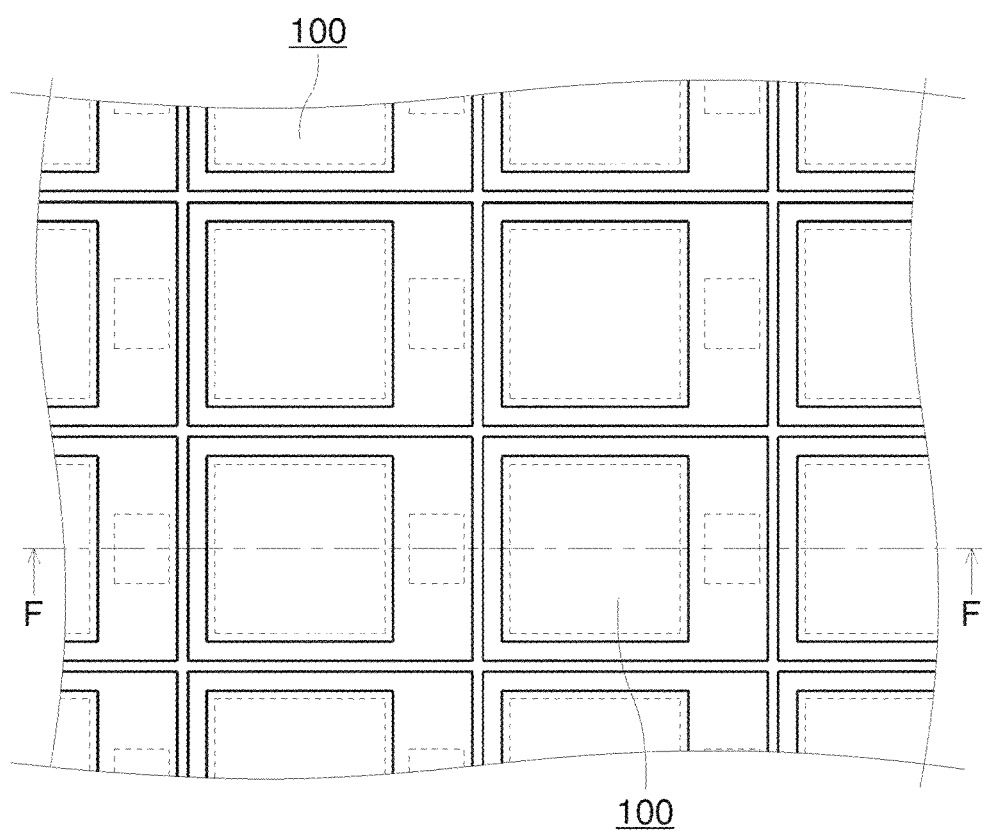
FIG. 6A is a schematic top view showing a step of the method for producing a light emitting device according to one embodiment of the present invention.
Figure 6B:
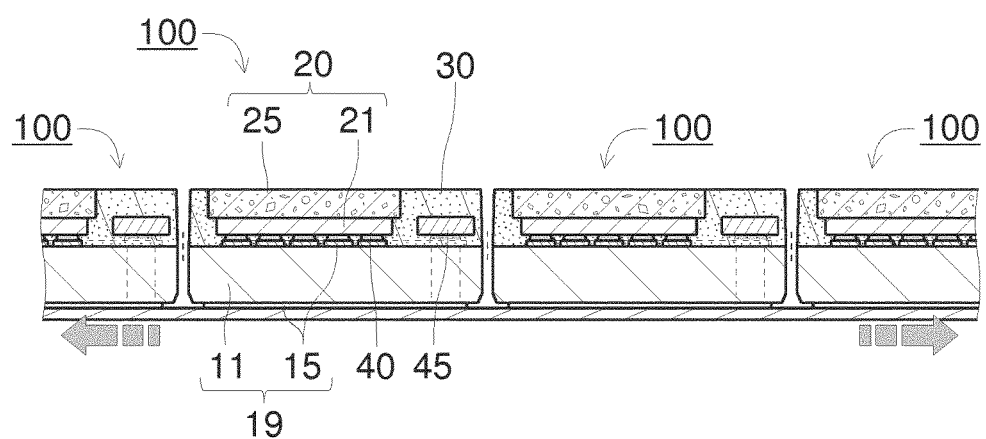
FIG. 6B is a schematic cross-sectional view taken along line F-F of FIG. 6A.

FIG. 2A is a schematic top view showing a step of the method for producing the light emitting device 100 according to Embodiment 1, and FIG. 2B is a schematic cross-sectional view taken along line B-B of FIG. 2A. FIG. 3A is a schematic bottom view showing a step of the method for producing the light emitting device 100 according to Embodiment 1, and FIG. 3B is a schematic cross-sectional view taken along line C-C of FIG. 3A. FIG. 4A is a schematic top view showing a step of the method for producing the light emitting device 100 according to Embodiment 1, and FIG. 4B is a schematic cross-sectional view taken along line D-D of FIG. 4A. FIG. 5A is a schematic top view showing a step of the method for producing the light emitting device 100 according to Embodiment 1, and FIG. 5B is a schematic cross-sectional view taken along line E-E of FIG. 5A. FIG. 6A is a schematic top view showing a step of the method for producing the light emitting device 100 according to Embodiment 1, and FIG. 6B is a schematic cross-sectional view taken along line F-F of FIG. 6A.

The method for producing the light emitting device 100 according to Embodiment 1 is a method for dividing a light emitting device array 50 to obtain individual (single) light emitting devices 100. In the light emitting device array, a plurality of light emitting elements 20, and a covering member 30 containing a silicone resin-based resin as the base material and covering a region surrounding the plurality of light emitting elements 20, are provided on the upper surface of a collective substrate 10, which includes a ceramic base member 11. The light emitting devices 100 are produced by dividing the light emitting device array 50, for example, by a process that includes the first to third steps described below.

The step shown in FIGS. 2A and 2B is the step of providing a light emitting device array 50 (the first step). Here, the explanation is premised on the production of the light emitting device array 50, but a ready-made light emitting device array 50 may be made available by purchasing, or the like. First, a plurality of light emitting elements 20 and a matching quantity of protective elements 45 are mounted on the upper face of a collective substrate 10. More specifically, a plurality of LED chips 21 are flip-chip mounted on the wirings 15 on the upper surface of a collective substrate via respective bonding members 40. Similarly, protective elements 45 are also flip chip mounted on the wirings 15 on the upper face of the collective substrate so that each one is adjacent to an LED chip 21. Furthermore, a light transmissive member 25 is adhered on the upper face of each of the LED chips 21 using, for example, a light transmitting adhesive. The order of the mounting of the LED chips 21 onto the collective substrate 10 and the adhesion of the light transmissive members 25 to the LED chips 21 may be reversed. Next, the covering member 30 that covers the surrounding of the plurality of light emitting elements 20 is formed. More specifically, the covering member 30 is formed, for example, by placing a frame-shaped projection at the perimeter of the upper face of the collective substrate 10, filling the interior of the projection with a covering member in liquid form 301 which is then be cured. Alternatively, the covering member 30 may be formed by transfer molding, or the like, using a mold. At this time, the protective elements 45 are completely embedded in the covering member 30. With this method, the light emitting device array 50 is formed in the process described above.

The step shown in FIGS. 3A and 3B is the step of forming scribe lines 10a on the lower surface of the collective substrate 10. More specifically, the scribe lines 10a are formed along predetermined division lines for the light emitting device array 50 (in the present embodiment, formed in a grid shape in the plan view) on the lower surface of the collective substrate 10. The scribe lines 10a are, for example, grooves having a V-shape in a cross-sectional view. The scribe lines 10a can be formed by using, for example, a laser scriber or a diamond scriber. The scribe lines 10a may be omitted, but it is preferable to form the scribe lines 10a in order to easily divide the light emitting device array 50 along the predetermined dividing lines. This step can be omitted in the case of providing a collective substrate 10 on which the scribe lines 10a are already formed. In the present embodiment, the predetermined dividing lines for the substrate are arranged so that each light emitting device 100 includes one light emitting element 20, but they may be arranged so that each light emitting device includes multiple light emitting elements.

The step shown in FIGS. 4A and 4B is the step of making a cut 30a into the covering member 30 (the second step). More specifically, the cut 30a is made on the upper surface of the covering member along the predetermined dividing lines for the light emitting device array 50 (in the present embodiment, formed in a grid shape in the plan view) by using a cutting blade 71. At this time, the cut 30a has a depth that an uncut portion 30b remains in the covering member 30a in a direction of the depth.

The step shown in FIGS. 5A and 5B is the step of push-splitting the collective substrate 10 (a part of the third step). More specifically, a push-splitting blade 75 is pushed into the collective substrate 10 to split the collective substrate 10 along the predetermined division lines for the light emitting device array 50 (in the present embodiment, to split in a grid shape in the plan view). The push-splitting blade 75 may be pushed into the collective substrate 10 in the direction from the lower surface side to the upper surface side. Considering the splitting of the uncut portion 30b described later, however, it is preferable to push the push-splitting blade 75 into the collective substrate 10 from the upper surface side to the lower surface side of the collective substrate 10 as shown in the FIG. 5B. At this time, the push-splitting blade 75 is preferably positioned immediately over a cut 30a of the covering member in a transparent plan view.

Finally, the remaining uncut portion 30b is split (a part of the third step). Here, as shown in FIGS. 5A and 5B, it is convenient and preferable to split the uncut portion 30b of the covering member simultaneously with the push-splitting of the collective substrate 10 because it is easy to perform. In other words, it is preferable to split the uncut portion 30b of the covering member as the collective substrate 10 is push-split because it is easy to perform. Besides this, as shown in FIGS. 6A and 6B, the splitting of the uncut portion 30b of the covering member may be performed by pulling apart the covering member 30 after push-splitting the collective substrate 10. More specifically, it is relatively easy, and thus preferable, to expand the expandable sheet on which the light emitting device array 50 has been adhered beforehand.

According to the method for producing light emitting devices 100 described above, the collective substrate 10 is push-split rather than cut by a rotary blade or the like, and the cut 30a in the covering member has a depth such that the uncut portion 30b remains in the direction of the depth, so that abrasion of a cutting tool that divide the light emitting device array 50 can be reduced. This allows for dividing the light emitting device array 50 in which a plurality of light emitting elements 20, and a covering member 30 containing a silicone-based resin as a base material 31 and covering the surrounding of the light emitting elements, are disposed on the upper surface of a collective substrate 10 that includes a ceramic base member 11. Accordingly, the light emitting device 100 can be produced with good mass productivity.

Preferred embodiments of the method for producing a light emitting device 100 will be explained below.

In the second step, the uncut portion 30b of the covering member may have an appropriate thickness d, but the thickness d is preferable to be 50 µm or less, more preferably 30 µm or less. With this thickness d, the uncut portion 30b of the covering member can be easily split either by using a push-splitting blade 75 or by pulling apart the covering member 30. The lower limit for the thickness d of the uncut portion 30b of the covering member may be, for example, 1 µm or more, preferably 5 µm or more. With this thickness d (in other words, the depth of a cut 30a), it can be easier to control the cutting blade 71 so as not to reach the upper surface of the collective substrate 10.

As shown in FIGS. 3A and 3B, the scribe lines 10a can be formed on the lower surface of the collective substrate 10 prior to the third step. As shown in FIGS. 4A and 4B, moreover, the cut 30a can be formed along the scribe lines 10a in the second step. Then, as shown in FIGS. 5A and 5B, the collective substrate 10 is preferably push-split along the scribe lines 10a in the third step. This can facilitate dividing the collective substrate 10 and the covering member 30 at the intended positions, and can facilitate efficiently dividing the light emitting device array 50.

As shown in FIG. 5B, ultrasonic waves are preferably applied to the blade to push-split (push-splitting blade 75) the collective substrate 10 in the third step. This allows for facilitating to split the uncut portion 30b of the covering member by a push-splitting blade 75.

As shown in FIG. 4B, in the second step, a non-rotating blade is preferably used as the cutting blade 71 to make a cut 30a into the covering member 30. Tearing the covering member 30 which contains a silicone-based resin as the base material 31 using a non-rotating cutting blade 71, instead of milling the covering member with a rotating blade or the like, can reduce the tool wear associated with the splitting of the covering member 30. Moreover, this can relatively swiftly split the covering member 30. Examples of non-rotating blades include a push- or draw-type cutter.

As shown in FIG. 4B, in the second step, ultrasonic waves are preferably applied to the non-rotating cutting blade 71. This allows for facilitating cutting the covering member 30 using the cutting blade 71, as well as making the inner faces of the cut 30a (portions of the cut end surfaces of the covering member 30) smooth.

Variant Example

Figure 7A:
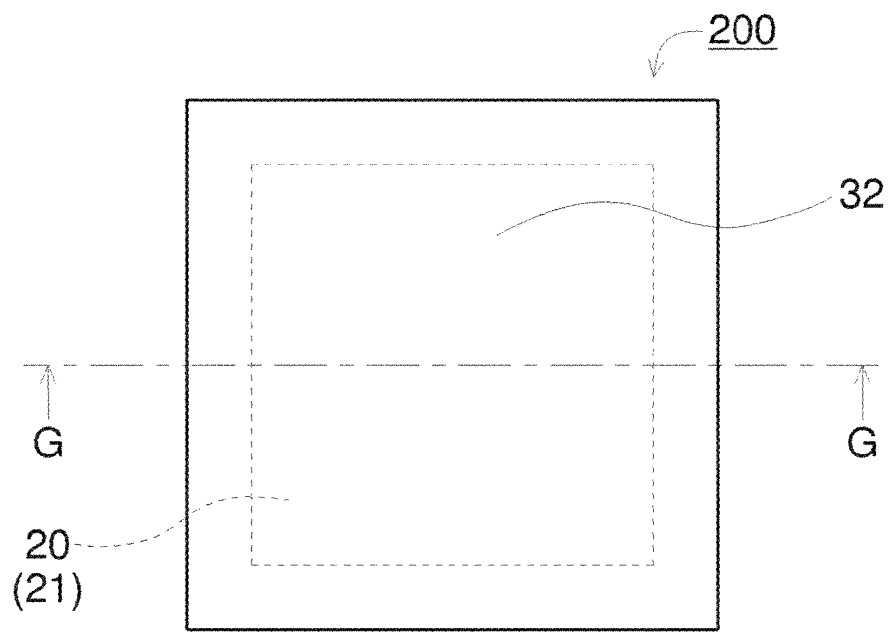
FIG. 7A is a schematic top view showing a light emitting device according to one variant example of one embodiment of the present invention.
Figure 7B:
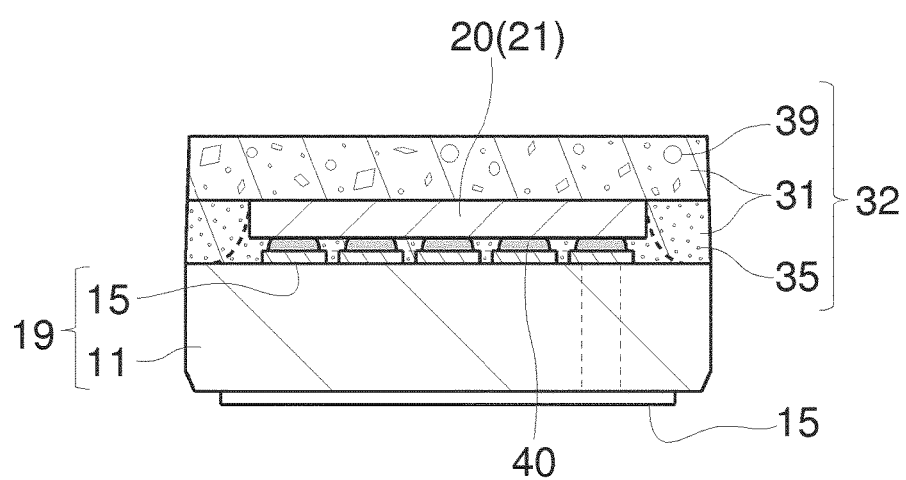
FIG. 7B is a schematic cross-sectional view taken along line G-G of FIG. 7A.

FIG. 7A is a schematic top view of the light emitting device 200 according to a variant example of Embodiment 1, and FIG. 7B is a schematic cross-sectional view taken along line G-G of FIG. 7A. The light emitting device 200 according to the variant example differs from the light emitting device 100 in respects that a covering member 32, instead of the light transmissive member 25, covers the upper side of the LED chip 21 (light emitting element 20), and that the light emitting device 200 does not include the protective element 45. Other features of the light emitting device 200 are substantially the same as the light emitting device 100.

As shown in FIG. 1B, the covering member 30 contains a white pigment 35. As shown in FIG. 7B, the covering member 32 contains the white pigment 35 and a fluorescent material 39. As such, the covering member 30 and 32 preferably contains the white pigment 35 and/or the fluorescent material 39. Making the cut 30a into the covering member 30 using a non-rotating cutting blade 71 allows the inner surfaces of the cut 30a (portions of the cut end surfaces of the covering member 30 or 32) to be smooth, and using a non-rotating cutting blade 71 allows for greatly reducing kerf loss of the covering member 30 or 32 due to the cut 30a. This, therefore, allows the covering members 30 and 32 containing a white pigment 35 to maintain good light shielding performances, and/or to maintain good light emission characteristics of the covering member 32 containing a fluorescent material 39, so that good light emission characteristics of the light emitting devices can be maintained.

As shown in FIG. 7B, moreover, the covering member 32 preferably includes a lower layer containing a white pigment 35 and an upper layer containing a fluorescent material 39. This can facilitate cutting the upper layer that contains the fluorescent material 39 with a non-rotating cutting blade 71, and can facilitate splitting the lower layer that contains the white pigment 35 simultaneously with the push-splitting the collective substrate 10, or pulling the covering member 30 apart. Therefore, good light emission characteristics of the light emitting device can be maintained.

An end surface of the covering member 30 of the light emitting device 100 and an end surface of the covering member 32 of the light emitting device 200 described above each includes an upper region, which is cut by the cutting blade 71, and a lower region, which is split by the push-splitting blade 75 or is torn apart by pulling. Sizes of the upper regions and the lower regions depend on the depth of the cut 30a (in other words, the thickness of the uncut portion 30b). In many cases, the upper region is thicker than the lower region. In many cases, moreover, the upper region is smoother than the lower region. The smoothness can be evaluated by, for example, the arithmetic average roughness Ra (that is, how small the value of Ra is).

Each of the constituent elements of the light emitting device according to one embodiment of the invention will be explained below.

Light Emitting Device 100 or 200, and Light Emitting Device Array 50

Examples of the light emitting devices include a surface-mounted type LED, more specifically a chip-on-board (COB) type or chip-scale-package (CSP) type LED. The light emitting device includes at least a substrate (single substrate), a light emitting element, and a covering member. More specifically, the light emitting device is configured so that the light emitting element, which is bonded to the substrate using a bonding member, is covered with the covering member. A light emitting device array, which is in a state prior to being divided (singulated) into such light emitting devices, is composed of a plurality of light emitting devices being continuously arranged vertically and/or horizontally.

Collective substrate 10 and Substrate (Single Substrate) 19

The collective substrate, which is in a state prior to being divided (singulated) into a single substrate of the light emitting device, is configured to include a plurality of single substrates continuously arranged vertically and/or horizontally. Each single substrate includes wirings to be electrically connected to a light emitting element, and a base member that holds the wirings. The substrate may have an appropriate thickness, and is, for example, in a range of 0.1 mm to 1 mm, preferably in a range of 0.2 mm to 0.8 mm, and more preferably in a range of 0.3 mm to 0.5 mm.

Base Member 11

The base member is made of ceramic, i.e., a sintered body of an inorganic material. More specifically, any one of an aluminum oxide, aluminum nitride, zirconium oxide, zirconium nitride, titanium oxide, titanium nitride, or a mixture of these can be used for the base member.

Wirings 15

The wirings are formed in the form of a foil or film at least on the upper surface of the base member, and may also be formed inside and/or on the lower surface of the base member. The wirings preferably each includes a land portion (die pad) to which a light emitting element is bonded, an external connecting terminal portion, and an extending wiring portion for connecting these. The wirings can each be a single layer or multiple layers of copper, iron, nickel, tungsten, chromium, aluminum, silver, gold, titanium, palladium, rhodium, or an alloy of these. In view of heat dissipation, in particular, the wirings preferably contain copper or a coper alloy. A light-reflecting layer made of silver, platinum, aluminum, rhodium, gold, tin, copper, or an alloy of these may be disposed on a surface of the wiring, and among these, silver or a silver alloy having higher light-reflectivity is preferable. These wirings can be formed by electrolytic plating, electroless plating, sputtering, vapor deposition, printing, coating, co-firing method, post-firing method, or the like.

Light Emitting Element 20

The light emitting element includes at least an LED chip, and may further include a light transmissive member. The light emitting elements mounted on one light emitting device may be singular or plural in number.

LED Chip 21

The LED chip includes at least a light emitting element structure, and in many cases further includes a substrate (chip substrate). A top-view shape of the LED chip is preferably rectangular, particularly a square or an oblong shape is preferable, but may be of another shape. A lateral surface of the LED chip (mainly a lateral surface of the chip substrate) may be perpendicular to the top surface, or slanted inward or outward. In the case of using an LED chip in which a pair of positive and negative (p, n) electrodes are disposed on the same surface side of the LED chip, each electrode may be connected to the wirings using a wire (face-up mounting), or each electrode may be bonded to the wirings using a conductive bonding member (flip chip mounting or face-down mounting). In the case of using an LED chip in which a pair of positive and negative electrodes are provided on opposite surfaces (upper and lower electrode structure) of a LED chip, a lower surface electrode is bonded to the wiring using a conductive bonding member, while an upper surface electrode is connected to the wiring using a wire. Multiple LED chips can be connected in series or in parallel.

Light Emitting Element Structure

The light emitting element structure includes a semiconductor stack, i.e., at least an n-type semiconductor layer and a p-type semiconductor layer, preferably including an active layer between the n-type semiconductor layer and the p-type semiconductor layer. The light emitting element structure may include an electrode and/or an insulating film. The electrode can be formed with any one of gold, silver, tin, platinum, rhodium, titanium, aluminum, tungsten, palladium, nickel, or their alloys. The insulating film can be formed with an oxide or nitride of at least one element selected from the group consisting of silicon, titanium, zirconium, niobium, tantalum, and aluminum. An emission wavelength of the light emitting element structure can be selected from the range of wavelengths from the ultraviolet region to infrared region in accordance with a semiconductor material of the light emitting element structure and a mixed crystal ratio of the semiconductor material. For the semiconductor material, it is preferable to use a nitride semiconductor (mainly expressed by the general formula, $In_xAl_yGa_{1-x-y}N$, $0 \leq x$, $0 \leq y$, $x+y \leq 1$), which is a material capable of emitting short-wavelength light that can efficiently excite fluorescent material. A peak emission wavelength of in a range of 400 nm to 530 nm is preferable for the light emitting element structure, in view of the complementary color relationship with an emitted light from a fluorescent material, degradation of the covering member, and the like, and more preferably in a range of 420 nm to 490 nm. In view of excitation of the fluorescent material and light emission efficiency of the fluorescent material, a peak emission wavelength in a range of 445 nm to 475 nm is even more preferable. Furthermore, InAlGaAs-based semiconductors, InAlGaP-based semiconductors, zinc sulfide, zinc selenide, silicon carbide, or the like, can also be employed as the semiconductor material.

Chip Substrate

The chip substrate is mainly a crystal growth substrate capable of growing semiconductor crystals composing the light emitting element structure, but may be a bonding substrate to be bonded with a light emitting element structure which has been separated from the crystal growth substrate. In the case where the chip substrate is light transmissive, flip-chip mounting of the LED chip can be easily employed, and the light extraction efficiency can be readily increased. In the case where the chip substrate is electrically conductive, a structure including an upper and lower electrode structure may be employed. For a material of the chip substrate, any one of sapphire, spinel, gallium nitride, aluminum nitride, silicon, silicon carbide, gallium arsenide, gallium phosphide, indium phosphide, zinc sulfide, zinc oxide, zinc selenide, or diamond can be used. The thickness of the chip substrate is, for example, from 0.02 mm to 1 mm, and from in view of the chip substrate strength and light emitting device thickness, preferably from 0.05 mm to 0.5 mm, more preferably from 0.1 mm to 0.3 mm.

Light Transmissive Member 25

The light transmissive member can transmit a light emitted from the LED chip (preferably light transmittance of at least 70%, more preferably at least 85%). For the base material of the light transmissive member, glass, a silicone resin, an epoxy resin, a phenol resin, a polycarbonate resin, an acrylic resin, or a modified or hybrid resin of these can be used. The light transmissive member can be a single layer of one of these base materials, or a multilayer in which two or more of these base materials are stacked. The light transmissive member preferably contains a fluorescent material and/or a filler (material similar to that discussed later) in the base material, but is not limited to that. Also, a sintered body of a fluorescent material and an inorganic material (e.g., alumina), a plate-like crystal of a fluorescent material, or the like, may be used as the light transmissive member.

Covering Member 30

The covering member may be, for example, one that is referred to as a "sealing member," "molded underfill," or the like. The covering member (particularly a portion located directly under the LED chip) also serves as an adhesive to reinforce the bonding between the bonding member and the wirings. The covering member is in a fluid state, i.e., liquid (including sol or slurry), before being cured. The covering member includes at least a base material, and the covering member optionally contains one or more of a white pigment, a fluorescent material, and a filler in the base material. More specifically, a portion of the covering member having light reflectivity contains at least a white pigment, and optionally further contains a filler. The portion of the covering member having transmissivity preferably contains a fluorescent material, and optionally further contains a filler.

Base Material 31 of the Covering Member

A silicone-based resin is used as the base material for the covering member. Silicone-based resins have good heat resistance and light resistance, and their volume shrinkage after curing is relatively small. Examples of the silicone-based resins include a silicone resin, a modified silicon resin and a hybrid resin containing silicone. More specific examples of silicone resins include dimethyl silicone resin and phenyl methyl silicone resin.

White Pigment 35

Examples of white pigments include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and the like. One of these white pigments can be used singly, or two or more can be used in combination. The covering member contains an appropriate amount of the white pigment. The higher a content of the white pigment in the covering member, the more preferable it is in view of a light reflectivity of the covering member. Since white pigments typically have submicron particle sizes (e.g., from 0.1 µm to 0.5 µm) and easily affect the fluidity of the covering member in liquid form, the content is preferably in a range of 10 wt % to 60 wt %, for example, more preferably in a range of 30 wt % to 50 wt %. The unit "wt %" is percentage by weight, and represents the ratio of the weight of the material to the total weight of the covering member (or the covering member in liquid form).

Fluorescent Material 29, 39

The fluorescent material absorbs at least some of primary light emitted by the LED chip, and emits secondary light having a different wavelength than primary light. Specific examples include cerium-activated yttrium aluminum garnet, europium- and/or chromium-activated calcium alumino-silicate containing nitrogen, europium-activated sialon, europium-activated silicate, manganese-activated potassium silicofluoride, and the like. Also, the fluorescent material may be quantum dots. Quantum dots are particles each having diameter of about 1 nm to 100 nm, and the emission wavelengths of quantum dots can be varied by the particle size. Examples of quantum dots include cadmium selenide, cadmium telluride, zinc sulfide, cadmium sulfide, lead sulfide, lead selenium, mercury cadmium telluride, and the like. For the fluorescent material, one of these can be used singly, or two or more of these can be used in combination. With this configuration, a light emitting device that emits mixed color light (e.g., white light) in which primary light and secondary light are mixed, each having a wavelength of visible light, or a light emitting device that emits secondary light having a wavelength of visible light by being excited by primary light which is ultraviolet light.

Filler

The filler may be an organic material, but an inorganic material is preferable because it has a lower thermal expansion coefficient. Examples of fillers include silica, glass, calcium silicate (wollastonite), potassium titanate, mica, talc, aluminum oxide, zirconium oxide, and the like. For the filler, one of these can be used singly, or two or more of these can be used in combination. For the filler, however, a material that is different from the white pigments described above is used. Among these materials, silica is particularly preferable. The filler may have an appropriate shape, but spherical shape is preferable from the viewpoint of the fluidity, while fibril or flaky (scale-like) shape is preferable in the case where the filler serves as a reinforcing material. The content of the filler in the covering member can be appropriately determined in accordance with a desired coefficient of thermal expansion of the covering member and/or the emission properties of the light emitting device. The content of the filler in the covering member is preferably in a range of, for example, 30 wt % to 80 wt %, more preferably in a range of 40 wt % to 60 wt %.

Bonding Member 40

The bonding member is a member for bonding an LED chip to the substrate. For an electrically-insulating bonding member, any one of epoxy resins, silicone resins, and their modified or hybrid resins can be used. For a conductive bonding member, any one of the following can be used: bumps made of gold, silver, copper, or the like; metal paste containing metal powder of silver, gold, copper, platinum, aluminum, palladium, or the like, and a resin binder; solders such as tin-bismuth-based solder, tin-copper-based solder, tin-silver-based solder, and gold-tin-based solder; and a brazing material made of a low melting point metal or the like.

Protective Element 45

The protective element is an element for protecting the light emitting element against static electricity and high-voltage surges. Specific examples of the protective element include a Zener diode, and the like.

EXAMPLES

Specific examples of the present invention will be described in detail below. It is needless to say that the present invention is not limited to the examples described below.

Example 1

The light emitting device according to Example 1 is a surface-mounted type and top-view mounting type LED of approximately parallelepiped shape with 1.43 mm in length, 1.8 mm in width, and 0.7 mm in thickness, which includes the structure of the light emitting device 100 shown in FIG. 1. This light emitting device was obtained by producing a light emitting device array and dividing the light emitting device array as discussed below.

The light emitting device array of Example 1 is produced by mounting a plurality of light emitting elements and protective elements of the same number with the light emitting elements, on the upper surface of a collective substrate, filling a region surrounding the light emitting elements and the protective elements with the covering member in liquid form by potting, and curing the covering member. The collective substrate is a large wiring board of 54 mm in length, 54 mm in width, and 0.4 mm in thickness. The collective substrate includes an aluminum nitride base member and a plurality of groups of through-vias filled with tungsten (W) and upper-surface wirings and lower-surface wirings made of TiW/Cu/Ni/Au on the base member. Each of the plurality of light emitting elements is flip-chip mounted on the upper-surface wirings of the collective substrate via an Au bump bonding member (about 0.1 mm in thickness). Each of the light emitting elements includes an LED chip, and a light transmissive member adhered on the LED chip by a dimethyl silicone adhesive. In the LED chip, a light emitting element structure including active layer made of a nitride semiconductor is formed on one of the main surfaces of a sapphire substrate, and the LED chip has a rectangular shape when viewed from above with a length of 1 mm, a width of 1 mm, and a thickness of 0.11 mm, capable of emitting blue light (peak emission wavelength of about 452 nm). The light transmissive member is a small piece of glass with a length of 1.15, a width of 1.15 mm, and a thickness of 0.18 mm, containing a YAG:Ce phosphor. The protective element is a Zener diode with a length of 0.41, a width of 0.33, and a thickness of 0.14 mm, disposed adjacent to the light emitting element, and flip-chip mounted on the upper-surface wirings via an Au bump. The covering member includes an inner portion (underfill portion) made of a phenyl methyl silicone resin base material containing 30 wt % of a titanium oxide white pigment, which mainly covers the region between the lower surface of each light emitting element and the collective substrate, and an outer portion made of a dimethyl silicone resin base material containing 30 wt % of a titanium oxide white pigment, which mainly covers the side surfaces (outer edges when viewed from above) of each light emitting element.

The light emitting device array described above is divided in steps as shown below. First, irradiating a fiber laser beam oscillating at a wavelength of 1064 nm is irradiated on the lower surface of the collective substrate to form scribe line in a grid shape in a plan view of the collective substrate. A depth of the scribe line is about 11 to 15% of the thickness of the collective substrate. Next, using an ultrasonic wave cutter as a cutting blade, cut is made into the upper face of the covering member in a grid shape in a plan view along the scribe line. The depth of the cut made into the covering member is such that an uncut portion with a thickness of about 10 to 30 µm remain in a direction of the depth on the collective substrate. The cutting blade is made of a superhard material (surface treatment is optional), and has an edge angle of 18 degree to 30 degree, and a tip radius of curvature of about 0.003 mm. Finally, the collective substrate is push-split along the scribe line by pushing a breaking blade as the push-splitting blade into the collective substrate from the cut side. This allows to simultaneously split the uncut portion of the covering member. The push-splitting blade is made of a superhard material (surface treated diamond-like carbon (DLC)), and has an edge angle of 18 degree to 30 degree, and a tip radius of curvature of about 0.03 mm to 0.1 mm. At this time, ultrasonic waves may be applied to the push-splitting blade.

According to the method for producing a light emitting device according to Example 1 described above, the production cost per light emitting device can be reduced by 0.25 yen as compared to dividing the same light emitting device array by dicing (that is, cutting with a rotary blade). Moreover, since kerf loss is greatly reduced, the method can increase the yield per one collective substrate from 812 to 898 pieces of light emitting devices (about 10%), so that the production cost can be further reduced.

INDUSTRIAL APPLICABILITY

The light emitting device according to one embodiment of the invention is applicable to backlight devices for liquid crystal displays, various types of lighting fixtures, large-sized displays, various display devices for use in advertisements and destination signs, projectors, as well as image pick-up devices used in digital video cameras, facsimiles, copiers, scanners, or the like.

DENOTATION OF REFERENCE NUMERALS 10 collective substrate
11 base member,
15 wirings
19 substrate (single substrate)
10a scribe line
20 light emitting element
21 LED chip
25 light transmissive member
29 fluorescent material
30, 32 covering member
301 covering member in liquid form
30a cut
30b uncut portion
31 base material
35 white pigment
39 fluorescent material
40 bonding member
45 protective element
50 light emitting device array
71 cutting blade
75 push-splitting blade
100 light emitting device

What is claimed is:
1. A method for producing a light emitting device, the method comprising:
providing a light emitting device array including a collective substrate, a plurality of light emitting elements, and a covering member covering a region surrounding the plurality of light emitting elements, the plurality of light emitting elements and the covering member being arranged on an upper surface of the collective substrate, the collective substrate including a ceramic base member, and the covering member containing a silicone resin as a base material, making a cut into the covering member such that the cut has a depth such that an uncut portion remains in the covering member in a direction of the depth, and after making the cut into the covering member, pushing a push-splitting blade into the cut in the covering member from a covering member side of the light emitting device array, so as to split the uncut portion of the covering member and push-split the collective substrate.

2. The method for producing a light emitting device according to claim 1, wherein the splitting of the uncut portion of the covering member is performed simultaneously with the push-splitting the collective substrate.

3. The method for producing a light emitting device according to claim 1, wherein the splitting of the uncut portion of the covering member is performed by pulling apart the covering member after the push-splitting of the collective substrate.

4. The method for producing a light emitting device according to claim 1, wherein a thickness of the uncut portion of the covering member in the making the cut into the covering member is 50 µm or less.

5. The method for producing a light emitting device according to claim 1, wherein scribe lines are formed on a lower surface of the collective substrate prior to the step of push-splitting the collective substrate, the step of making the cut is performed along the scribe lines, and the collective substrate is push-split along the scribe lines in the step of push-splitting the collective substrate.

6. The method for producing a light emitting device according to claim 1, wherein ultrasonic waves are applied to the push-splitting blade in the step of push-splitting the collective substrate.

7. The method for producing a light emitting device according to claim 1, wherein the step of making the cut is performed using a non-rotating blade.

8. The method for producing a light emitting device according to claim 7, wherein ultrasonic waves are applied to the non-rotating blade.

9. The method for producing a light emitting device according to claim 7, wherein the covering member contains a white pigment and/or a fluorescent material.

10. The method for producing a light emitting device according to claim 9, wherein the covering member includes a lower layer containing the white pigment, and an upper layer containing the fluorescent material.

11. The method for producing a light emitting device according to claim 2, wherein a thickness of the uncut portion of the covering member in the step of making the cut into the covering member is 50 µm or less.

12. The method for producing a light emitting device according to claim 11, wherein the scribe lines are formed on the lower surface of the collective substrate prior to the step of push-splitting the collective substrate, the step of making the cut is performed along the scribe lines, and the collective substrate is push-split along the scribe lines in the step of push-splitting the collective substrate.

13. The method for producing a light emitting device according to claim 12, wherein ultrasonic waves are applied to the push-splitting blade in the step of push-splitting the collective substrate.

14. The method for producing a light emitting device according to claim 13, wherein the step of making the cut is performed using a non-rotating blade.

15. The method for producing a light emitting device according to claim 14, wherein ultrasonic waves are applied to the non-rotating blade.

16. The method for producing a light emitting device according to claim 3, wherein a thickness of the uncut portion of the covering member in the step of making the cut into the covering member is 50 µm or less.

17. The method for producing a light emitting device according to claim 16, wherein scribe lines are formed on the lower surface of the collective substrate prior to the step of push-splitting the collective substrate, the step of making the cut is performed along the scribe lines, and the collective substrate is push-split along the scribe lines in the step of push-splitting the collective substrate.

18. The method for producing a light emitting device according to claim 17, wherein ultrasonic waves are applied to the push-splitting blade in the step of push-splitting the collective substrate.

19. The method for producing a light emitting device according to claim 18, wherein the step of making the cut is performed using a non-rotating blade.

20. The method for producing a light emitting device according to claim 19, wherein ultrasonic waves are applied to the non-rotating blade.

21. The method for producing a light emitting device according to claim 1, wherein the cut in the covering member is made using a cutting blade.

* * * * *